(12) United States Patent
Park et al.

(10) Patent No.: US 6,391,749 B1
(45) Date of Patent: May 21, 2002

(54) SELECTIVE EPITAXIAL GROWTH METHOD IN SEMICONDUCTOR DEVICE

(75) Inventors: Jung-Woo Park, Seoul; Jong-Ryul Yoo, Kyunggi-do; Jung-Min Ha, Seoul; Si-Young Choi, Kyunggi-do, all of (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/880,912

(22) Filed: Jun. 15, 2001

(30) Foreign Application Priority Data

Aug. 11, 2000 (KR) .................................. 2000-46680

(51) Int. Cl.$^7$ .................... H01L 21/20; H01L 21/26; H01L 21/36
(52) U.S. Cl. .............. 438/478; 438/488; 438/694; 438/734; 438/933
(58) Field of Search ................. 438/488, 504, 438/694, 478, 718, 714, 734, 933, 974

(56) References Cited

U.S. PATENT DOCUMENTS

| | | | | |
|---|---|---|---|---|
| 5,037,775 A | * | 8/1991 | Reisman | 437/89 |
| 5,221,424 A | * | 6/1993 | Rhoades | 156/643 |
| 5,425,843 A | * | 6/1995 | Saul et al. | 156/643.1 |
| 5,578,163 A | * | 11/1996 | Yachi | 156/643.1 |
| 5,770,100 A | * | 6/1998 | Fukuyama et al. | 216/69 |
| 6,204,136 B1 | * | 3/2001 | Chan et al. | 438/305 |

FOREIGN PATENT DOCUMENTS

JP          4-139819          5/1992

* cited by examiner

Primary Examiner—John F. Niebling
Assistant Examiner—Angel Roman
(74) Attorney, Agent, or Firm—Lee & Sterba, P.C.

(57) ABSTRACT

A method of selective epitaxial growth performed by sequentially and repeatedly introducing a source gas, an etching gas, and a reducing gas in the reaction chamber, wherein controlled epitaxial layer doping may be obtained by introducing a dopant source gas during introducing any one of the source gas, an etching gas, and a reducing gas, and thereby producing a smooth and uniform epitaxial layer on a predetermined region of a semiconductor substrate.

18 Claims, 2 Drawing Sheets

SELECTIVE EPITAXIAL GROWTH METHOD IN SEMICONDUCTOR DEVICE

BACKGROUND OF THE INVENTION

1. Field of the Invention

The present invention relates to a method of fabricating a semiconductor device. More particularly, the present invention relates to a method of selective epitaxial growth for a semiconductor device.

2. Description of the Related Art

As integrated circuit devices become more highly integrated and include finer geometries, the width and spacing between interconnections have also been reduced. In order to avoid misalignment problems associated with highly integrated circuit devices, a self-alignment technology has been required.

A selective epitaxial growth technique has been suggested as one of the self-alignment techniques. The selective epitaxial growth technique is mainly used to grow a semiconductor layer such as a silicon layer or a germanium layer on a predetermined region of a semiconductor substrate.

Japanese Laid-open Patent No. 4139819 discloses a method of selectively growing a silicon layer by alternately and repeatedly injecting disilane ($Si_2H_6$) gas and chlorine ($Cl_2$) gas into a chamber in which a silicon substrate is loaded. Here, the disilane gas is used as a silicon source gas, and the chlorine gas is used as an etching gas for removing silicon nuclei on an insulating layer.

According to the Japanese Laid-open Patent No. 4139819, chlorine atoms are adsorbed on a surface of the silicon layer grown on the silicon substrate during injection of the chlorine gas. Accordingly, the silicon layer is passivated with chlorine atoms. As a result, the silicon layer is grown very slowly, even though the silicon source gas is injected in a subsequent step.

SUMMARY OF THE INVENTION

It is therefore a feature of an embodiment of the present invention to provide a selective epitaxial growth method, which is capable of improving a growth selectivity as well as a growth rate.

It is another feature of an embodiment of the present invention to provide a selective epitaxial growth method, which is capable of removing defects due to the etching gas.

It is still another feature of an embodiment of the present invention to provide a selective epitaxial growth method, which is capable of easily adjusting a doping concentration of impurities by using an in-situ doping method.

These features can be provided by a selective epitaxial growth method in fabrication of a semiconductor device. This method comprises loading a semiconductor substrate having an insulating layer pattern on a predetermined region of the semiconductor substrate into a chamber and repeatedly (at least two times) performing the growth process, wherein each of the growth processes includes three steps of sequentially injecting a source gas, an etching gas and a reducing gas. The insulating layer pattern may correspond to an isolation layer formed at a predetermined region of the semiconductor substrate. Also, the insulating layer may further include a capping layer covering a top surface and a spacer covering a sidewall of a gate electrode.

After loading the semiconductor substrate into the chamber, the chamber is evacuated using a vacuum pump, to maintain a pressure lower than atmospheric pressure, and then the semiconductor substrate is heated and maintained at a predetermined temperature. The source gas is then injected into the chamber. Here, the source gas comprises a gas for growing a semiconductor layer. For example, the source gas comprises a silicon source gas, germanium source gas or combination gas thereof. At this time, the source gas is decomposed by heat energy in the chamber, thereby generating silicon nuclei, germanium nuclei or silicon germanium (Si-Ge) nuclei. Thus, the silicon nuclei, the germanium nuclei or the silicon germanium nuclei are bonded with dangling bonds at the surface of the semiconductor substrate. As a result, a semiconductor layer is formed on the entire surface of the semiconductor substrate.

After formation of the semiconductor layer, the injection of the source gas is stopped and the etching gas, e.g., chlorine gas, is injected into the chamber. The etching gas reacts with the atoms of the semiconductor layer and a by-product gas compound is vented out of the chamber. Thus, the semiconductor layer formed on the insulating layer pattern is selectively removed. On the contrary, the semiconductor layer formed on the exposed semiconductor substrate still exists. This is because the adsorption coefficient at the surface of the insulating layer pattern is different from that of the exposed semiconductor substrate. Meanwhile, the surface of the semiconductor layer that exists on the exposed semiconductor substrate may be passivated with atoms of the etching gas during injection of the etching gas. That is to say, the atoms of the etching gas may be bonded with the atoms of the semiconductor layer.

After stopping the injection of the etching gas, the reducing gas such as hydrogen gas is injected into the chamber. The reducing gas reacts with the atoms of the passivation layer, thereby removing the passivation layer. As a result, a new semiconductor layer may be easily grown on the previous semiconductor layer during injection of the source gas in a subsequent step.

In addition, a dopant gas may be additionally injected into the chamber during at least one process of the processes of injecting the source gas, the etching gas and the reducing gas. Thus, it is easy to separately control the doping concentrations of the semiconductor layers. As a result, it is possible to obtain a desirable doping profile as per the depth of the total semiconductor layers. The dopant gas may be a phosphine ($PH_3$) gas, a diborane ($B_2H_6$) gas or an arsine ($AsH_3$) gas.

These and other features of the present invention will be readily apparent to those of ordinary skill in the art upon review of the detailed description that follows.

BRIEF DESCRIPTION OF THE DRAWINGS

Other features of the present invention will be more readily understood from the following detailed description of specific embodiments thereof when read in conjunction with the accompanying drawings, in which.

DETAILED DESCRIPTION OF PREFERRED EMBODIMENTS

Korean Patent Application No. 2000-46680, filed on Aug. 11, 2000, and entitled: "Selective Epitaxial Growth Method in Semiconductor Device," is incorporated by reference herein in its entirety.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those of ordinary skill in the art.

Figure 1:
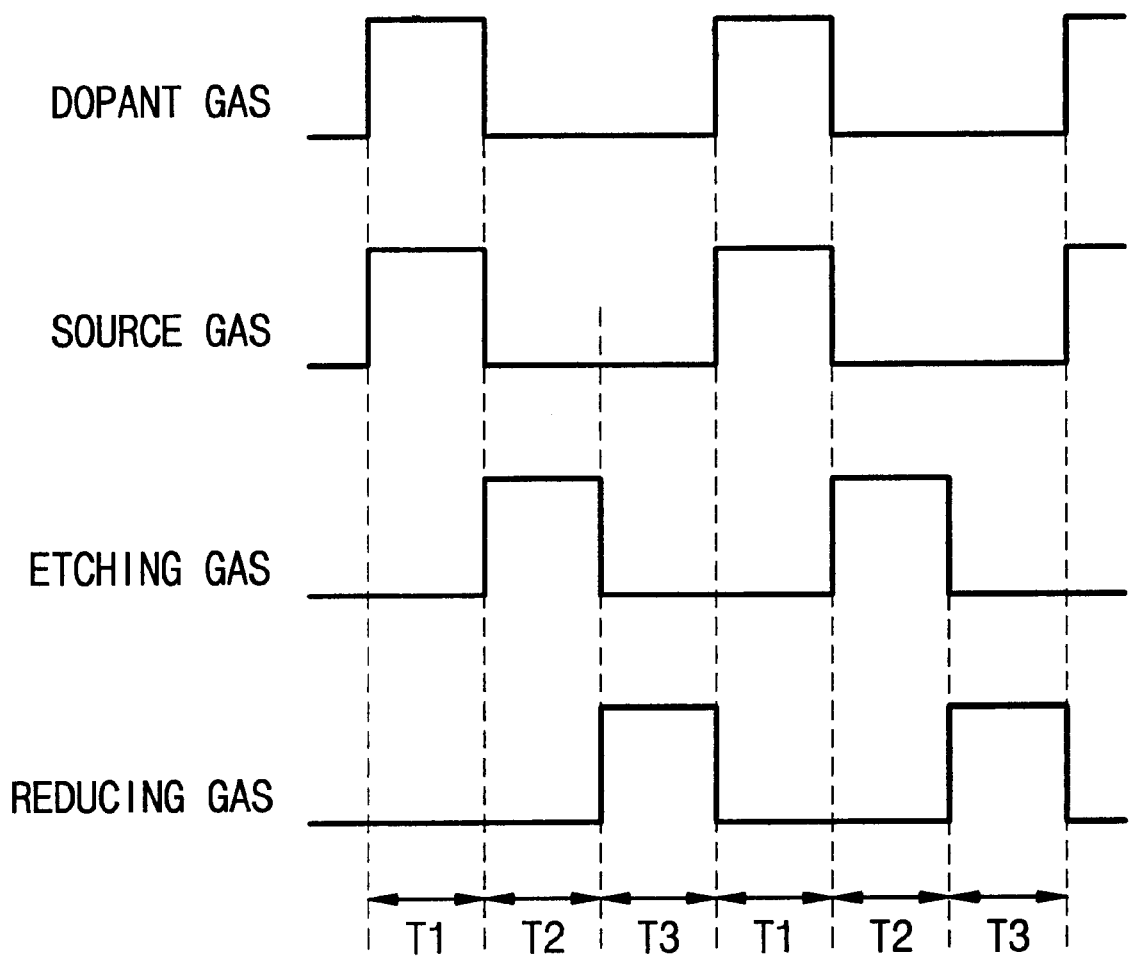
FIG. 1 illustrates a timing diagram for a method of selective epitaxial growth according to the present invention.
Figure 2:
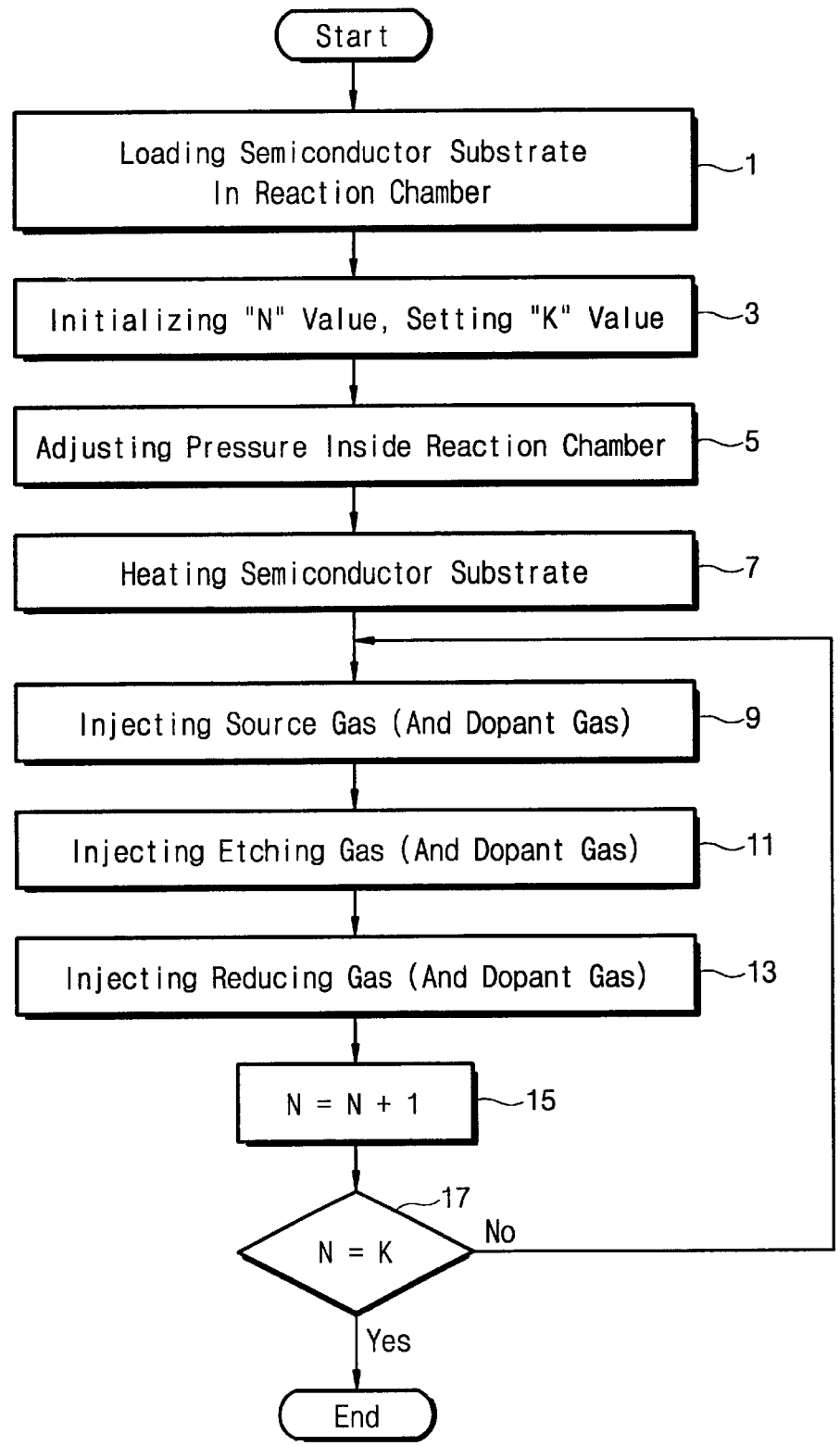
FIG. 2 illustrates a process flowchart for a method of selective epitaxial growth according to the present invention.

Referring concurrently to FIGS. 1 and 2, an insulating layer pattern is formed on a semiconductor substrate, thereby exposing a predetermined region of the semiconductor substrate. The semiconductor substrate having the insulating layer pattern is loaded into a reaction chamber of an epitaxial apparatus 1. An "N" value allocated in a first register of a controller in the expitaxial apparatus is initialized to "0", and a "K" value allocated in a second register thereof is set to a predetermined number of process cycles 3. Here, the "N" value indicates the number of cycle of the process that is actually performed in the reaction chamber. On the contrary, the "K" value indicates the desirable number of cycles, which is required by an operator to obtain a particular epitaxial layer thickness. The air in the chamber is then evacuated by the vacuum pump, thereby lowering the pressure in the chamber. At this time, it is preferable that the pressure in the chamber is controlled to $10^{-8}$ Torr or lower 5. The semiconductor substrate is then heated to a predetermined temperature, e.g., 450C to 800° C. 7.

A source gas is injected into the chamber containing the heated semiconductor substrate for a first duration T1, e.g., 8 to 12 seconds 9. Accordingly, the source gas is decomposed by heat energy. Atoms decomposed from the source gas are bonded to the dangling bonds of the exposed semiconductor substrate and the insulating layer pattern. Thus, a thin semiconductor layer is formed on the entire surface of the substrate. For example, in the event that silane ($SiH_4$) gas, disilane ($Si_2H_6$) gas or dichlorosilane ($SiH_2Cl_2$) gas is used as the source gas and a silicon substrate is used as the semiconductor substrate, silicon atoms are adsorbed on the entire, surface of the silicon substrate having the insulating layer pattern. A thin silicon layer is formed on the entire surface of the substrate. At this time, the silicon layer grown on the exposed silicon substrate has the same crystal orientation as the silicon substrate.

Selecting the source gas depends on the semiconductor layer to be formed. For example, a silicon source gas is used as the source gas in order to form a silicon layer, and a germanium source gas is used as the source gas in order to form a germanium layer. Also, the source gas may comprise the silicon source gas and the germanium source gas in order to form Ge-Si layer. The silicon source gas comprises silane ($SiH_4$) gas, disilane ($Si_2H_6$) gas or dichlorosilane ($SiH_2Cl_2$) gas, and the germanium source gas comprises $GeH_4$ gas. In addition, a compound semiconductor layer may be formed by using other source gases except for the above source gases.

After stopping the injection of the source gas, an etching gas is injected into the chamber for a second duration T2, e.g., 6 to 15 seconds 11. The etching gas comprises a gas that reacts highly with the atoms of the semiconductor layer on the insulating layer pattern. That is to say, it is preferable that the etching gas is a chlorine gas. For example, in the event that the semiconductor layer is a silicon layer, the silicon layer on the insulating layer pattern reacts with the chlorine gas, thereby generating a by-product (gas compound) such as a $SiCl_4$ gas. Alternatively, in the event that the semiconductor layer is a germanium layer, the germanium layer on the insulating layer pattern reacts with the chlorine gas, thereby generating a by-product (gas compound) such as a $GeCl_4$ gas. The gas compound is then vented out of the chamber. As a result, the semiconductor layer on the insulating layer is selectively removed.

Unlike the reaction of the etching gas with the atoms of the semiconductor layer on the insulating layer pattern, the etching gas does not generate a volatile gas compound such as the $SiCl_4$ gas or the $GeCl_4$ gas with the semiconductor layer on the exposed semiconductor substrate. Rather, atoms of the etching gas are adsorbed at the surface of the semiconductor layer on the exposed semiconductor substrate, thereby forming a passivation layer on the semiconductor layer. This occurs because the bonding energy between the atoms of the semiconductor layer is much stronger than the reaction energy between the etching gas and the semiconductor layer. Once the passivation layer is formed, the growth rate of a new semiconductor layer on the previous semiconductor layer becomes much slower or the new semiconductor layer may not be grown at all, even though the source gas is provided in a subsequent step. In other words, it is difficult to obtain a uniform growth rate throughout the substrate. As a result, in the case when a passivation layer is present, the surface roughness of the semiconductor layer, including rectangular shaped grooves, is remarkably increased. The grooves are formed due to the local presence of the passivation layer.

After stopping the injection of the etching gas, a reducing gas is introduced in the chamber for a third duration T3, e.g., 6 to 15 seconds 13. Preferably, the reducing gas is a hydrogen gas. The hydrogen gas easily reacts with the passivation layer (chlorine layer), thereby generating HCl gas to remove the passivation layer on the semiconductor layer.

After stopping the injection of the reducing gas, the "N" value is increased by "1" 15. The increased "N" is compared to the "K" 17. The steps 9, 11, 13 of injecting the source gas, the etching gas and the reducing gas are repeatedly performed until the "N" value is equal to the "K" value, thereby forming a semiconductor layer having a desirable thickness.

In the meantime, a dopant gas may be additionally injected in the chamber during at least one step of the first to third durations T1, T2, T3. For instance, the semiconductor layer can be doped with the impurities by introducing the dopant gas in the chamber during the first duration (T1) as illustrated in FIG. 1. The dopant gas may comprise a phophine ($PH_3$) gas, diborane ($B_2H_6$) gas or arsine ($AsH_3$) gas. Thus, it is possible to form an in-situ doped semiconductor layer. In addition, it is easy to form the in-situ doped semiconductor layer having a desirable doping profile by appropriately varying the flow rate of the dopant gas as per each process cycle.

EXAMPLES

A silicon layer was selectively grown on a predetermined region of a semiconductor substrate according to an embodiment of the present invention as described above. Also, a conventional silicon layer was selectively grown on a predetermined region of another semiconductor substrate in order to compare with the present invention. Here, the semiconductor substrate was provided by forming an isolation layer at a predetermined region of a single crystalline silicon substrate to define an active region and forming a plurality of gate patterns crossing over the active region. The isolation layer was formed of a silicon oxide layer using a trench isolation technique, and the gate patterns were formed by successively patterning a doped polysilicon layer, a tungsten, silicide layer and a high temperature oxide layer, which have been sequentially stacked Also, a spacer composed of silicon nitride was formed on the sidewalls of the gate patterns. As a result, the isolation layer, the gate patterns, and the spacer expose a portion of the semiconductor substrate such as a source/drain region.

After loading the substrate into the chamber, the pressure in the chamber was reduced to $2 \times 10^{-8}$ Torr. The substrate was then heated to a temperature of 700° C. Then, disilane ($Si_2H_6$) gas as a silicon source gas was introduced into the chamber at a flow rate of 10 sccm (standard cubic centimeter per minute) for 10 seconds. Next, chlorine gas as an etching gas was introduced in the chamber at a flow rate of 1 sccm for 12 seconds. Subsequently, hydrogen gas as a reducing gas was introduced in the chamber at a flow rate of 25 sccm for 12 seconds. However, this reducing gas was not supplied during the growth of the semiconductor layer using the conventional technology. In the case of the present invention, the source gas injection process, the etching gas injection process and the reducing gas injection process were repeatedly and sequentially performed for 30 cycles. Also, in case of the conventional technology, the source gas injection process and the etching gas injection process were repeatedly and alternately performed for 30 cycles.

As a result of the above experiment, the growth rate of the silicon layer according to the present invention was faster than that of the conventional technology. More particularly, in the case of the present invention, the thickness of the silicon layer grown on the source/drain region in a cell array region was 2060 angstrom, and the thickness of the silicon layer grown on the source/drain region in a peripheral circuit region having a relatively low pattern density was 2600 angstrom. On the contrary, in case of the conventional technology, the thickness of the silicon layer grown on the source/drain region in the cell array region was 1650 angstrom, and the thickness of the silicon layer grown on the source/drain region in a peripheral circuit region was 2000 angstrom.

Also, the root mean square (RMS) value to the surface roughness of the silicon layer according to the present invention was 10 angstrom, and the root mean square (RMS) value to the surface roughness of the conventional silicon layer was 21.7 angstrom. In addition, the groove density (per length) of the silicon layer according to the present invention was 1.4/um to 1.8/um, and the groove density (per length) of the conventional silicon layer was 2.4/um to 3.0/um.

As described above, according to the present invention, it is possible to remarkably improve the growth rate, the surface roughness and the groove density of the epitaxial layer by sequentially introducing the source gas, the etching gas and the reducing gas in the chamber. Also, it is possible to obtain the excellent growth selectivity of the epitaxial process.

While the invention has been particularly shown and described with reference to the preferred embodiments thereof, it will be understood by those of ordinary skill in the art that various changes in form and details may be made without departing from the spirit and scope of the invention.

What is claimed is:

1. A method of selective epitaxial growth comprises:

forming an insulating layer pattern on a semiconductor substrate, the insulating layer pattern exposing a predetermined region of the semiconductor substrate;

loading the semiconductor substrate having the insulating layer pattern into a reaction chamber;

introducing a source gas into the reaction chamber for a first duration to form a semiconductor layer on the exposed semiconductor substrate and the insulating layer pattern;

introducing an etching gas into the reaction chamber for a second duration to selectively remove the semiconductor layer on the insulating layer pattern; and introducing a reducing gas into the reaction chamber for a third duration to remove atoms of the etching gas adsorbed on the surface of the semiconductor layer, wherein introducing the source gas, the etching gas and the reducing gas is repeatedly performed for at least 2 cycles.

2. The method of claim 1 further comprises reducing a pressure in the reaction chamber to $10^{-8}$ Torr or lower, prior to introducing the source gas.

3. The method of claim 1 further comprises heating the semiconductor substrate to a temperature of 450° C. to 800° C., prior to introducing the source gas.

4. The method of claim 1, wherein the semiconductor layer is a silicon layer.

5. The method of claim 4, wherein the source gas is a silicon source gas.

6. The method of claim 5, wherein the silicon source gas is a silane ($SiH_4$) gas, a disilane ($Si_2H_6$) gas or a dichlorosilane ($SiH_2Cl_2$) gas.

7. The method of claim 1, wherein the semiconductor layer is a germanium layer.

8. The method of claim 7, wherein the source gas is a germanium source gas.

9. The method of claim 8, wherein the germanium source gas is a $GeH_4$ gas.

10. The method of claim 1, wherein the semiconductor layer is a Ge-Si layer.

11. The method of claim 10, wherein the source gas comprises a silicon source gas and a germanium source gas.

12. The method of claim 1, wherein the first duration is in the range of 8 to 12 seconds.

13. The method of claim 1, wherein the etching gas is a chlorine (Cl) gas.

14. The method of claim 1, wherein the second duration is in the range of 6 to 15 seconds.

15. The method of claim 1, wherein the reducing gas is a hydrogen gas.

16. The method of claim 1, wherein the third duration is in the range of 6 to 15 seconds.

17. The method of claim 1 further comprises introducing a dopant gas into the chamber during introducing any one of the source gas, the etching gas and the reducing gas.

18. The method of claim 17, wherein the dopant gas is a phosphine ($PH_3$) gas, a diborane ($B_2H_6$) gas or an arsine ($AsH_3$) gas.

* * * * *